United States Patent [19]

Beach

[11] Patent Number: 5,689,522

[45] Date of Patent: Nov. 18, 1997

[54] HIGH EFFICIENCY 2 MICROMETER LASER UTILIZING WING-PUMPED $Tm^{3+}$ AND A LASER DIODE ARRAY END-PUMPING ARCHITECTURE

[75] Inventor: Raymond J. Beach, Livermore, Calif.

[73] Assignee: The Regents of the University of California, Oakland, Calif.

[21] Appl. No.: 537,371

[22] Filed: Oct. 2, 1995

[51] Int. Cl.[6] .................. H01S 3/091; H01S 3/094
[52] U.S. Cl. .................. 372/75; 372/41
[58] Field of Search .................. 372/75, 41, 70, 372/101; 359/710

[56] References Cited

U.S. PATENT DOCUMENTS

| | | | |
|---|---|---|---|
| 4,974,230 | 11/1990 | Hennati | 372/41 |
| 5,038,353 | 8/1991 | Esterowitz et al. | 372/41 |
| 5,105,434 | 4/1992 | Krupke et al. | 372/75 |
| 5,155,631 | 10/1992 | Snyder et al. | 372/101 |
| 5,289,482 | 2/1994 | Esterowitz et al. | 372/41 |
| 5,307,430 | 4/1994 | Beach et al. | 372/101 |

OTHER PUBLICATIONS

Ghisler, et al. "A Tm3+ sensitized Ho3+ silica fiber . . . ", Optics Comm. 109, Jul. 1, 1994 pp. 279–281.

*Primary Examiner*—Akm E. Ullah
*Assistant Examiner*—Robert E. Wise
*Attorney, Agent, or Firm*—Henry P. Sartorio; John P. Wooldridge

[57] ABSTRACT

Wing pumping a $Tm^{3+}$ doped, end pumped solid state laser generates 2 μm laser radiation at high average powers with high efficiency. Using laser diode arrays to end-pump the laser rod or slab in the wing of the $Tm^{3+}$ absorption band near 785 nm results in 2-for-1 quantum efficiency in $Tm^{3+}$ because high $Tm^{3+}$ concentrations can be used. Wing pumping allows the thermal power generated in the rod or slab to be distributed over a large enough volume to make thermal management practical in the laser gain medium even at high average power operation. The approach is applicable to CW, Q-switched, and rep-pulsed free-laser operation.

17 Claims, 4 Drawing Sheets

HIGH EFFICIENCY 2 MICROMETER LASER UTILIZING WING-PUMPED TM³⁺ AND A LASER DIODE ARRAY END-PUMPING ARCHITECTURE

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the generation of 2 micron laser radiation, and more specifically, it relates to a laser utilizing wing pumped $Tm^{3+}$ and an end pumping configuration to efficiently produce 2 micron light.

2. Description of Related Art

At sufficiently high doping concentrations and in many crystalline hosts, $Tm^{3+}$ is well known to give two excited state laser ions, useful for generating 2 µm laser radiation, per single absorbed pump photon when pumped in its absorption band centered at approximately 785 nm. This 2-for-1 quantum efficiency is beneficial because it increases the overall efficiency of the laser system and results in less waste thermal heat generation than would be the case if each absorbed pump photon only resulted in a single excited $Tm^{3+}$ ion. One draw-back of scaling this approach to high average power operation has been the heavy doping required, which leads to short absorption lengths for the pump laser excitation beam in the $Tm^{3+}$ doped crystalline laser gain medium. This in turn leads to high intensity thermal power generation within the $Tm^{3+}$ doped laser crystal which is detrimental to both the laser performance and efficiency. To date, this thermal management problem has limited the average power capability of diode pumped $Tm^{3+}$ laser systems to under 15 W of 2 µm laser radiation.

SUMMARY OF THE INVENTION

It is an object of the present invention to provide a $Tm^{3+}$ doped laser utilizing an end-pumping architecture and wing-pumped excitation.

The invention takes advantage of the beneficial 2-for-1 quantum efficiency that can be had in highly doped $Tm^{3+}$ laser crystals without incurring the short pump absorption lengths and the resulting high intensity thermal loads that can negatively impact the laser system's performance. This is accomplished by exciting or pumping the $Tm^{3+}$ doped laser crystal on the wing of its absorption feature where absorption is low and the pump radiation can penetrate deeply through the crystal giving an extended and low intensity thermal source that can be easily managed, rather than pumping at the center of the absorption feature, as is the usual practice, where absorption is high and occurs over a short length giving a high intensity thermal source that cannot be easily managed and so negatively impacts the laser's performance.

To access the long absorption lengths required for wing-pumping requires that the $Tm^{3+}$ doped laser crystal be end-pumped, allowing the pump radiation to be absorbed as it is transported along the length of the laser rod or slab. There are several techniques which can be employed in end-pumping a laser rod using semiconductor laser diode arrays. One of the techniques is to use fiber-coupled arrays in which the pump radiation from a laser diode array is delivered through the ends of multiple fibers that are bundled together at their output end and individually coupled to laser diode apertures at their input end. Another technique uses microchannel cooler technology, cylindrical microlens technology, and lens duct technology, to deliver high average power diode pump radiation to the end of a $Tm^{3+}$ doped laser rod or slab. Wing pumping $Tm^{3+}$ laser rods or slabs as disclosed here, substantially increases the average power of the 2 micron radiation that can be generated in diode pumped $Tm^{3+}$ laser systems.

The 2 micron laser radiation of the present invention has many practical applications because it is strongly absorbed by water and also because it is an 'eye safe' wavelength. The strong absorption of 2 micron radiation by water makes this laser a very attractive candidate for performing laser surgical procedures as most tissue types are predominately composed of liquid water. The fact that 2 micron radiation is considered to be 'eye-safe' makes this laser attractive for many laser range finding and remote sensing applications where other laser wavelengths could pose a safety hazard. Examples of this are wind sensing to detect shear forces at airports, and laser rangefinding and tracking of objects in populated areas.

DETAILED DESCRIPTION OF THE INVENTION

In the invention, a laser crystal is doped with $Tm^{3+}$ ions and has an end pump face coated to transmit light within a range of about 755 nm to about 815 nm. The pump input face of the laser crystal is coated to be reflective at about 2 micrometers (approximately 1.9 to 2.15 micrometers) and to be highly transmissive at the pump wavelength. The output face of the laser crystal may be coated to be highly transmissive at about 2 microns so that an external mirror can be used to close the laser cavity or it may be partially reflective at about 2 microns thereby incorporating the laser oupout mirror directly onto the end of the laser rod. In this configuration the ouput end of the laser rod may also be fabricated with some radius of curvature on it. The laser crystal is end pumped at a wavelength located on the wings of the main absorption feature of the laser crystal, which is located at about 785 nm. The wings are located within two ranges, one from about 755 nm to about 775 nm and the other from about 790 nm to about 815 nm.

Exciting or pumping a $Tm^{3+}$ doped laser crystal on the wing of its absorption feature where absorption is low and the pump radiation can penetrate deeply through the crystal gives an extended and low intensity thermal source that can be easily managed, rather than pumping at the center of the absorption feature, as is the usual practice, where absorption is high and occurs over a short length giving a high intensity thermal source that cannot be easily managed and so negatively impacts the laser's performance. The beneficial 2-for-1 quantum efficiency that can be had in highly doped $Tm^{3+}$ laser crystals is advantageously used without incurring the too short pump absorption lengths and the resulting high intensity thermal loads that can negatively impact the laser system's performance. To access the long absorption lengths required for wing pumping requires that the $Tm^{3+}$ doped laser crystal be end-pumped, allowing the pump radiation to be absorbed as it is transported along the length of the laser rod or slab.

Several techniques can be employed in end-pumping a laser rod by using extended semiconductor laser diode arrays. One of the techniques is to use fiber-coupled arrays. In this approach, the pump radiation from a laser diode array is delivered through the ends of multiple fibers that are bundled together at their output end and individually coupled to the laser diode emitting apertures at their input end. Fibers are then coupled at their output ends to a $Tm^{3+}$ doped laser rod. To complete the cavity, a laser output coupler is placed on the optical axis of laser rod.

Figure 1A:
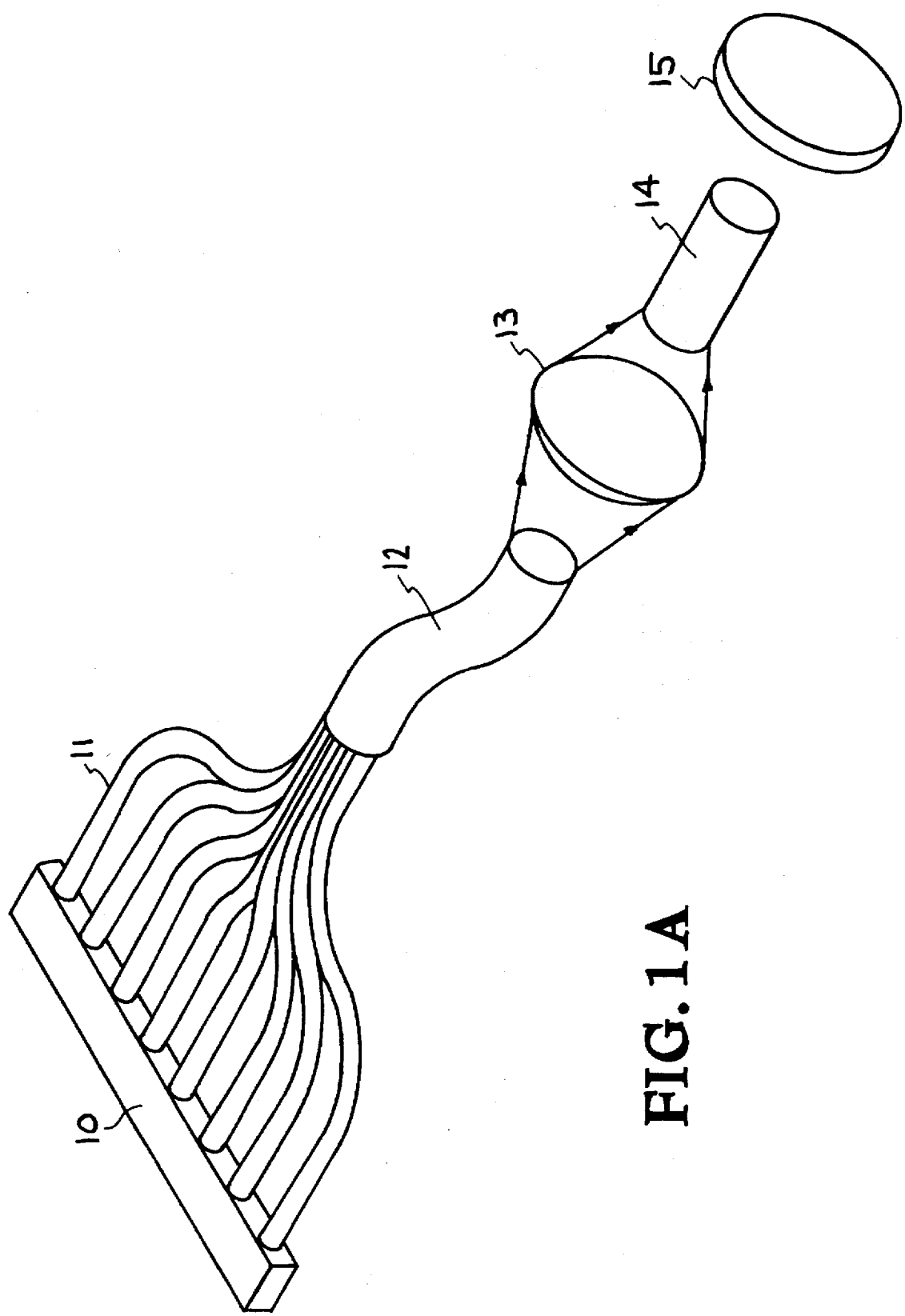
FIG. 1A shows the laser end-pumped with a laser diode bar coupled to the laser rod through a single fiber optic bundle.
Figure 1B:
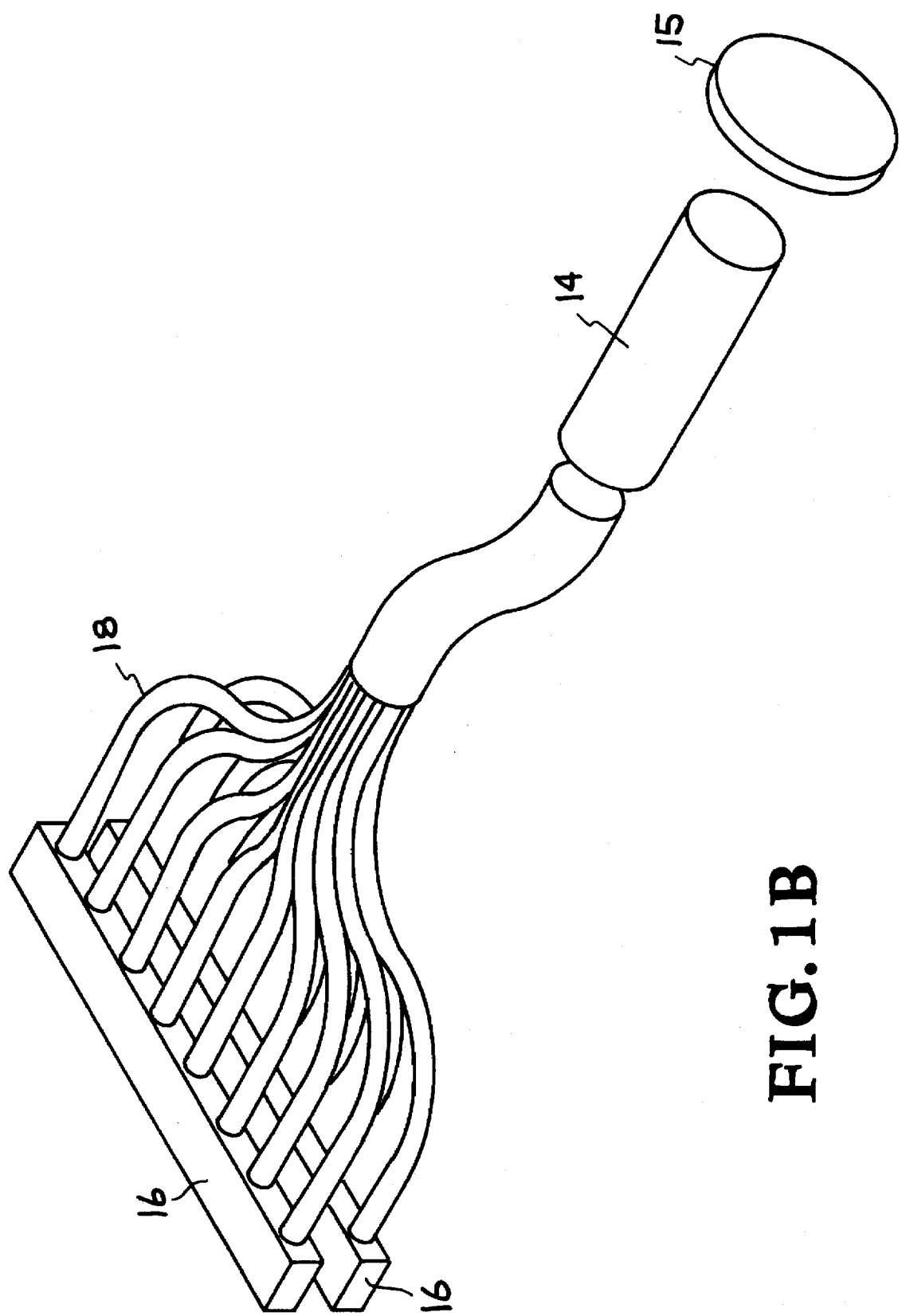
FIG. 1B shows the laser end-pumped with a laser diode bar coupled to the laser rod through multiple fiber optic bundles.

FIG. 1A shows a single laser diode bar 10 with its output apertures coupled to multiple fibers 11 that are bundled together at output end 12. A lens 13 may be used to deliver light from output end 12 into the end of laser rod 14, which is typically coated to be highly transmissive at about 785 nm. The pump input end of laser rod 14 is made highly reflective at 2 microns. The other end can be made either highly transmissive at 2 microns as would be done if an external mirror were to be used as the ouput coupler mirror or it may be partialy reflective at 2 microns such that the output mirror is directly incorporated onto the laser rod. Laser output mirror 15 is placed on the optical axis of laser rod 14 to complete an optical cavity. FIG. 1B shows multiple laser diode bars 16 having output apertures coupled to fiber optic bundle 18 which is end coupled to laser rod 14. Laser output mirror 15 completes the optical cavity.

Figure 2:
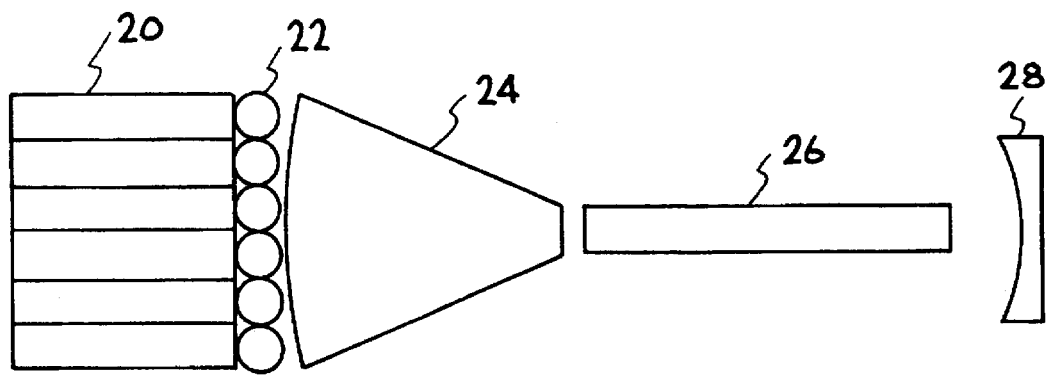
FIG. 2 shows a laser that is end-pumped with a stack of microchannel cooled laser diode arrays coupled to the laser rod through cylindrical microlenses and a lensing duct.

Another technique for end-pumping a laser rod uses microchannel cooler technology, cylindrical microlens technology, and lens duct technology, to deliver high average power diode pump radiation to the end of a $Tm^{3+}$ doped laser rod or slab. FIG. 2 shows a laser that is end-pumped with a stack of microchannel cooled laser diode arrays coupled to the laser rod through cylindrical microlenses and a lensing duct. In the figure, microchannel cooled laser diode array 20 is coupled by cylindrical microlens 22 and lensing duct 24 into $Tm^{3+}$ doped laser rod or slab 26, with laser output coupler 28 placed on the optical axis of laser rod 26 to complete the laser cavity.

The microchannel cooler technology is disclosed in U.S. Pat. No. 5,105,429, which is incorporated herein by reference. The laser diode array includes a plurality of planar packages and active cooling. The laser diode array may be operated in a long duty cycle, or in continuous operation. A laser diode bar and a microchannel heat sink are thermally coupled in a compact, thin planar package having the laser diode bar located proximate to one edge. In an array, a number of such thin planar packages are secured together in a stacked configuration, in close proximity so that the laser diodes are spaced closely. The cooling means includes a microchannel heat sink that is attached proximate to the laser bar so that it absorbs heat generated by laser operation. To provide the coolant to the microchannels, each thin planar package comprises a thin inlet manifold and a thin outlet manifold connected to an inlet corridor and an outlet corridor. The inlet corridor comprises a hole extending through each of the packages in the array, and the outlet corridor comprises a hole extending through each of the packages in the array. The inlet and outlet corridors are connected to a conventional coolant circulation system. The laser diode array with active cooling has application as an optical pump for high power solid state lasers. Further, it can be incorporated in equipment such as communications devices and active sensors, and in military and space applications, and it can be useful in applications having space constraints and energy limitations.

One embodiment of the laser diode array used in this invention comprises a compact, thin planar package including a laser diode bar and cooling means internal to the package. Electric current is provided to the laser diode bar by a conventional electric current source. The laser diode bar is positioned proximate to the edge so that emitted laser light is substantially unobstructed by the top surface. Coolant such as water is circulated through the package by a conventional coolant circulation system. Coolant enters the package through an inlet corridor, and exits through an outlet corridor.

When a plurality of these packages are connected to form an array, a number of the thin planar packages are secured together in a stacked arrangement. In this embodiment, the planar packages are secured together by a bolt extending through a hole formed in the packages. In other embodiments, an array may comprise any number of the packages from two and up. On the bottom side of the bottom package, the bolt is secured by a nut. Coolant is provided from the coolant circulation system through an inlet tube and an outlet tube. In an array, the thin packages are connectable in such close proximity that the laser diode bars are very closely spaced and therefore provide a high intensity laser output over an area as large as the number of packages.

Each package is constructed of three separate wafers. When bonded together, the wafers provide the package that has cooling means integral therein. The top wafer preferably comprises a silicon substrate, the middle wafer comprises a glass material, and the bottom wafer preferably comprises a silicon substrate. The bottom wafer comprises a manifold that is etched on its top surface. The manifold may comprise a series of ribs, such as the rib which provides structural strength to the manifold. When the bottom wafer is bonded to the middle wafer, the manifold forms a passageway for coolant flow between the inlet corridor and a slot formed in the middle wafer.

A manifold is formed in the top wafer to create a passageway for coolant flow between the outlet corridor and a microchannel heat sink. A plurality of ribs are provided in the manifold, which provide structural strength to the manifold. The heat sink is formed in the top wafer proximate to the laser diode bar. In that position, the heat sink conducts heat away from the laser diode bar, to the coolant flowing through it. The heat sink comprises a plurality of microchannels formed in the substrate of the silicon wafer in accordance with conventional techniques.

In operation, coolant provided in the inlet corridor flows into and through the inlet manifold, and then into the slot. From there, coolant flows into the microchannel heat sink where heat from the laser diode bar is absorbed. Then, the heated coolant flows through the manifold formed in the top wafer, and into the outlet corridor where it is cooled and recirculated by the coolant circulation system. In an array, the inlet corridor and the outlet corridor is common to all the planar packages in the array, and thus only a single coolant circulation system is required for the entire array.

In an array of packages, the thinness of the wafers is an advantage because the laser diode bars can be positioned in close proximity for high intensity output over a large area, while maintaining a low temperature due to the cooling action of the microchannel heat sinks. Although the packages may appear to be rectangular boxes, in one embodiment the packages are thin planar packages, and therefore can be placed closely together.

U.S. Pat. No. 5,155,631, incorporated herein by reference, provides a diffraction limited, high numerical aperture (fast) cylindrical microlens. The method for making the microlens is adaptable to produce a cylindrical lens that has almost any shape on its optical surfaces. The cylindrical lens may have a shape, such as elliptical or hyperbolic, designed to transform some particular given input light distribution into some desired output light distribution. In the method, the desired shape is first formed in a glass preform. Then, the preform is heated to the minimum drawing temperature and a fiber is drawn from it. The cross-sectional shape of the fiber bears a direct relation to the shape of the preform from which it was drawn. During the drawing process, the surfaces become optically smooth due to fire polishing. The microlens has many applications, such as integrated optics, optical detectors and laser diodes. The lens, when connected to a laser diode bar, can provide a high intensity source of laser radiation for pumping a high average power solid state laser. In integrated optics, a lens can be used to couple light into and out of apertures such as waveguides. The lens can also be used to collect light, and focus it on a detector.

The following are design considerations that may be considered when designing any particular cylindrical microlens. The optical path between the vertex of the dielectric interface and the focus is equated with any other optical path to the focus:

$$n_2 f = n_1 x + n_2 \sqrt{(f-x)^2 + y^2} \quad (1)$$

where $n_1$ and $n_2$ are the indices of refraction of the media to the left and right of the interface, respectively, and f is the focal length from the interface to the focus. The equation can be rearranged into the standard form for a conic section centered at x=a(8)

$$\frac{(x-a)^2}{a^2} + \frac{y^2}{b^2} = 1 \quad (2)$$

where $$a^2 = \left(\frac{f n_2}{n_2 + n_1}\right)^2 \quad (3)$$

and $$b^2 = f^2 \left(\frac{\pm \Delta n}{n_2 + n_1}\right) \quad (4)$$

are the squares of the semi-major and semi-minor axes, respectively, and $$\Delta n \equiv n_2 - n_1 \quad (5)$$

The eccentricity of the conic section is $$e \equiv \sqrt{1 \pm b^2/a^2} = \frac{n_1}{n_2} \quad (6)$$

where the lower sign is Eqs. (4) and (6) holds for $n_1 > n_2$.

There are two categories of surfaces free of spherical aberration. If the high index medium is on the right (i.e., $n_1 > n_2$) then the coefficient of the $y^2$ term in Eq. (2) is positive and the curve is an ellipse. Since the focal point is inside the higher index medium, this form has the properties of an immersion lens. If the high index medium is on the left then the coefficient of the $y^2$ term in Eq. (2) is negative and the curve is a hyperbola. For both curves, the focal point of the lens coincides with a focus of the conic section, since from Eqs. (3) and (6) the focal length is $$f = a\left(\frac{n_2 + n_1}{n_2}\right) = a + ea \quad (7)$$

The quantity a is the distance along the x axis from the vertex of the conic section to its center, and ea is the distance from the center to the focus.

Since the focal length is proportional to the semi-major axis, and the eccentricity (Eq. (6)) depends only on the indices of refraction, scaling the lens' dimensions uniformly also scales the focal length.

Theoretically, the maximum numerical aperture for a plano-elliptical lens is:

$$M.N.A._{ell} = n^2 \left(\frac{b}{a}\right) = \sqrt{n_2^2 - n_1^2} \quad (8)$$

where $n_2$=the index of refraction in the lens, $n_1$=the index of refraction in the surrounding media, a=the distance of the semi-major axis of the ellipse, and b=the distance of the semi-minor axis of the ellipse. If the elliptical lens is in air, as is usual, then the maximum numerical aperture is:

$$M.N.A._{ell} = \sqrt{n^2 - 1} \quad (9)$$

For example, if the elliptical lens is made of a material having an index of 1.78 at 800 nm, then the maximum possible numerical aperture is 1.47. A higher index lens material would of course provide a higher numerical aperture.

In fabricating a plano-elliptical cylindrical lens, a 0.75 cm wide preform was generated from a stock rod (having an index of 1.78 at 800 nm) on a numerically controlled universal grinder. The elliptical lens had a focal length of 220 microns, and the index of refraction was 1.78. The semi-major axis a=141.0 microns, the semi-minor axis b=117.0 microns, and the eccentricity e=0.56. The lens thickness was chosen to approximately match the focal length of 220 microns so that the lens could be attached directly to the output facet of a laser diode using index matched optical cement. Furthermore, full diffraction-limited performance was observed using an interferogram analysis. Diffraction limited performance over a 150 micron aperture (N.A.=0.6) was determined by means of interferometric analysis.

The lens duct technology is disclosed in U.S. Pat. No. 5,307,430, which is incorporated herein by reference. A lensing duct is used to condense (intensify) light using a combination of front surface lensing and reflective waveguiding. The duct tapers down from a wide input side to a narrow output side, with the input side being lens-shaped and coated with an antireflective coating for more efficient transmission into the duct. The four side surfaces are uncoated, preventing light from escaping by total internal reflection as it travels along the duct (reflective waveguiding). The duct has various applications for intensifying light, such as in the coupling of diode array pump light to solid state lasing materials, and can be fabricated from inexpensive glass and plastic.

The lensing duct is used to condense (intensify) light using a combination of front surface lensing and reflective waveguiding. A lensing duct positioned in a beam of light will produce a smaller beam with greater intensity. The lensing duct is adapted, for example, to be positioned between a laser diode array and a rod of laser medium to intensify the light produced by the diode array on the laser medium to enhance pumping of the laser medium. The lensing duct tapers down from a wide input end or side to a narrow output end or side, with the input end or side being curved or lens-shaped and coated with an antireflective coating for more efficient transmission into the duct, with the sides preventing light from escaping by total internal reflection as it travels through the duct to the output end or side which may or may not be antireflective coated. As pointed out above, the lensing duct is particularly applicable for increasing the intensity of a laser diode beam used to pump solid state lasers. The lensing duct may be constructed of glass, plastic, or other materials which are optically transparent and has the ability to be polished.

One embodiment of the lensing duct of the present invention is utilized in the end diode pumped laser oscillator of FIG. 2. The lensing duct includes an input side or end, an output side or end, and interconnecting sides or surfaces. The input side or end is curved or lens-shaped and coated with an antireflective material for more efficient transmission of light into the lensing duct. The output side or end is a flat configuration and includes an antireflective coating which may be omitted if desired for certain applications. The sides or surfaces are flat and configured so as to form a taper down from the width of input side or end to the width of the output side or end, and are not coated as light is prevented from escaping by total internal reflection at these surfaces as it travels towards the output end. The sides or surfaces perform a waveguide function in channeling the light from end to end. In this embodiment, each of the sides are tapered such that the output end is centrally located relative thereto so as to provide uniformity of light convergence from the input to the output of duct onto a side surface of a laser rod. By comparison, each of the four sides of the lensing duct may be tapered so that the light converges onto an end surface of a laser rod, as seen in FIG. 2.

By way of example, the lensing duct may be fabricated from glass, plastic, or other material which is optically transparent and can be polished. The curvature of the face of input side or end is dependent on the specific application. Generally, the length can be determined by the formula:

$$L = \alpha \frac{nR}{n-1}$$

where L is the length, n is the index of the refraction of the duct material, R is the radius of curvature of the input face and $\alpha$ is a numerical optimization factor that may change depending on the particular embodiment of the lensing duct. In general $\alpha$ will be near to but less than unity such that the output face of the lensing duct is located at the circle of least confusion when the lensing duct is viewed as an immersion lens.

By exciting $Tm^{3+}$ in the wing of its main absorption feature near 785 nm, the absorption length of the pump laser within a heavily doped Tm crystal can be made long enough that thermal management is practical even at high average power operation. The wing pumping invention of $Tm^{3+}$ laser rods or slabs as disclosed here, substantially increases the average power of the 2 micron radiation that can be generated in diode pumped $Tm^{3+}$ laser systems. To date, using the wing-pumping approach disclosed here with end-pumping technology which utilizes lens ducts, greater than 25 W of cw 2 micron radiation has been generated from a 4% doped Tm:YAG rod wing-pumped at 805 nm.

Figure 3:
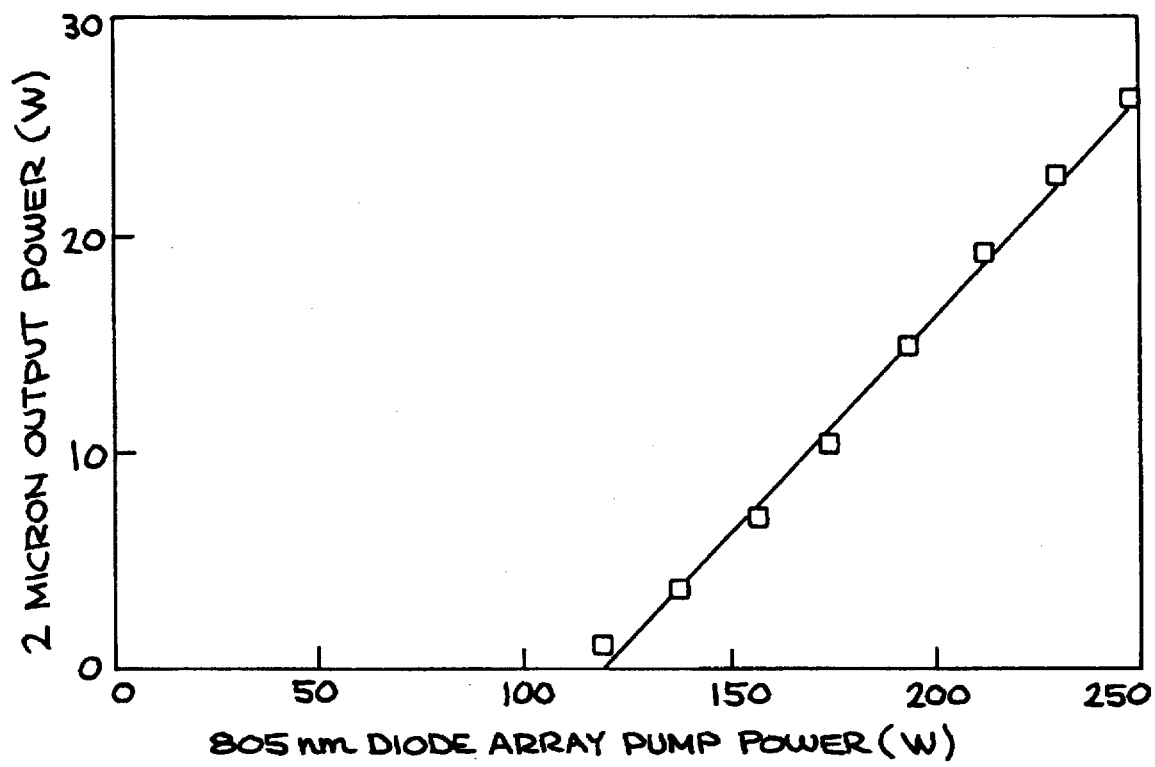
FIG. 3 shows experimental results confirming that greater than 25 W of average power 2 µm laser radiation can be generated by using the wing-pumping technique in conjunction with end-pumping technology.

Using a microchannel cooled laser diode array, a cylindrical microlens and a lensing duct, as shown in FIG. 2, high average power diode pump radiation can be delivered to a Tm doped crystal rod. By using a Tm:YAG rod in which the Tm is doped in at approximately 3% or more, two excited laser ions result from a single pump photon absorbed in the wing of the 785 nm absorption band due to a cross relaxation process. By pumping in the wing, i.e., using laser diodes emitting off to the side of the principal absorption feature, it is possible for the pump radiation to penetrate deeply enough into the laser rod that the resulting thermally generated power in the rod is distributed over a large enough volume that thermal management of the laser rod becomes practical even when the laser is operated at high average power. FIG. 3 shows that average power 2 µm laser radiation increases linearly as the diode array pump power increases when using this wing-pumping technique in conjunction with end-pumping technology. Greater than 100 W should be achievable with this technique. This is significantly more average power than has been generated from diode pumped Tm lasers to date using approaches other than the wing-pumping disclosed here.

Figure 4:
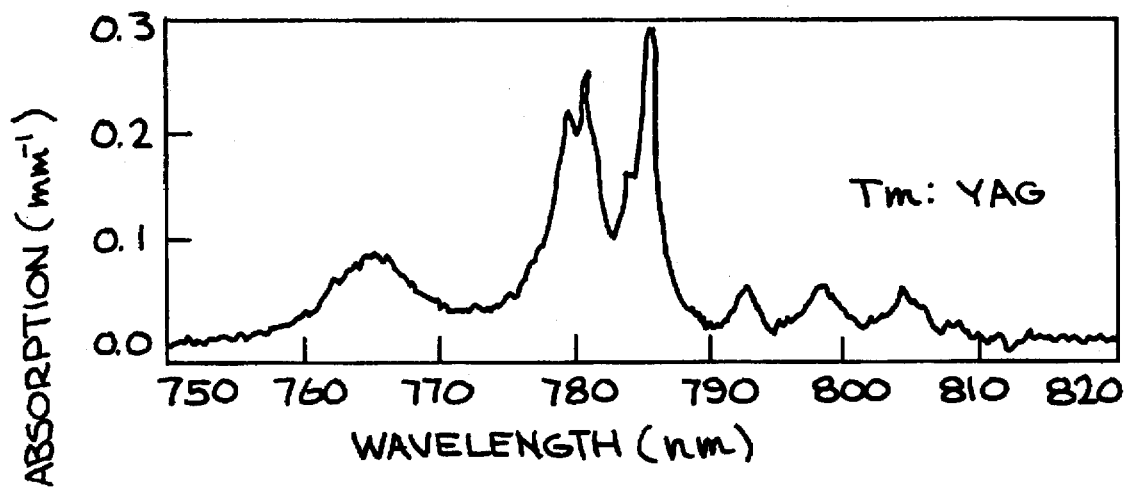
FIG. 4 shows the wing pump regions for Tm:YAG.
Figure 5:
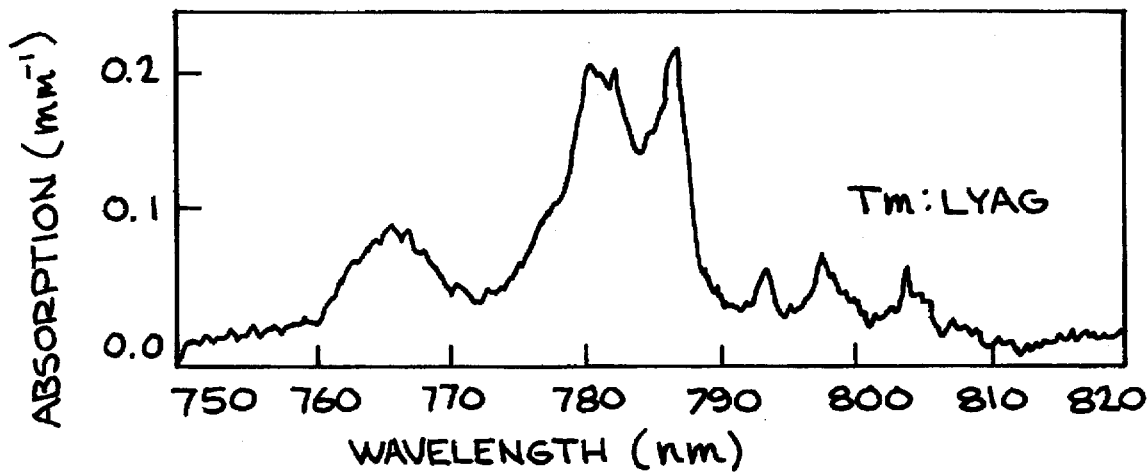
FIG. 5 shows the wing pump region for Tm:LYAG.
Figure 6:
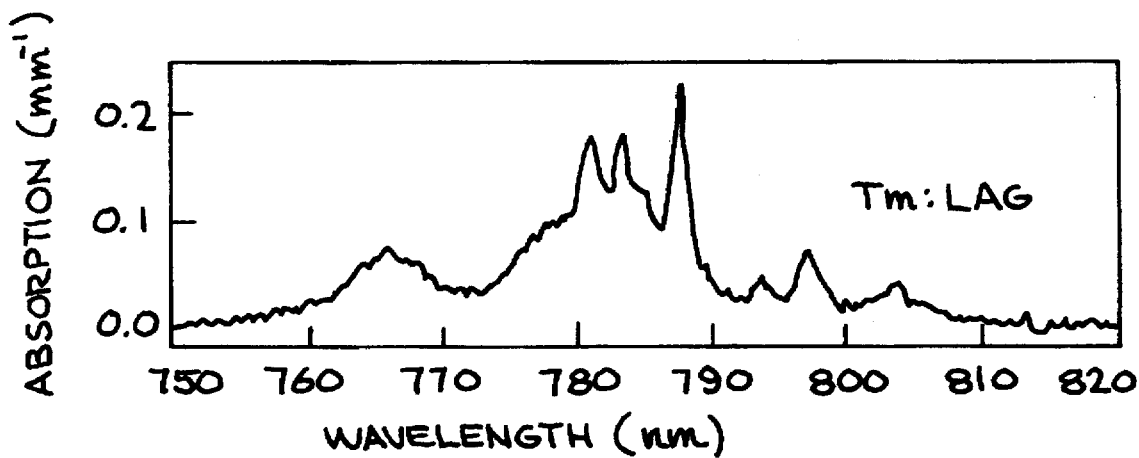
FIG. 6 shows the wing pump region for Tm:LAG.

FIG. 4 shows the wing-pump regions for Tm:YAG. FIG. 5 shows the wing-pump region for Tm:LYAG. FIG. 6 shows the wing-pump region for Tm:LAG. In all three cases, the pump wavelengths are located off the main absorption feature which is located at approximately 785 nm. Output power can be optimized by observing real time power measurements while slightly tuning the diode laser output about the disclosed wavelengths. Given these examples, the concept may be applied to the absorption profile of other laser crystals doped with $Tm^{3+}$. Some crystals that can be successfully doped with $Tm^{3+}$ include $LiYF_4$, $BaY_2F_8$, $Y_3Al_5O_{12}$ (YAG), $(Y,Lu)_3Al_5O_{12}$ (LYAG), $Lu_3Al_5O_{12}$ (LAG), $LaF_3$, $YAlO_3$, $La_2Be_2O_5$, $CaWO_4$, $YVO_4$, $GdAlO_3$, $Y_2SiO_5$, and $Gd_3Ga_5O_{12}$.

The invention has application in wind shear measurements, material processing, medical applications, anti sensor and sensor spoofing applications, and remote sensing. Other uses include applications requiring 2 µm eye safe laser operation such as LIDARS. Because 2 µm radiation is strongly absorbed by water, it is being actively used in surgical studies.

Changes and modifications in the specifically described embodiments can be carried out without departing from the scope of the invention, which is intended to be limited by the scope of the appended claims.

I claim:

1. An apparatus, comprising:

a laser crystal doped with $Tm^{3+}$ ions and having an end pump face coated to transmit light within a first range of about 755 nm to about 815 nm, said laser crystal comprising an output face, wherein said end pump face is coated to reflect light at about 2 micrometers; and means for end pumping said laser crystal at a wavelength located on the wings of its main absorption feature, wherein said main absorption feature is located at approximately 785 nm, wherein said wings are located within a second range and a third range, wherein said second range is from about 755 nm to about 775 nm and wherein said third range is from about 790 nm to about 815 nm, wherein said $Tm^{3+}$ ions produce laser light when said laser crystal doped with $Tm^{3+}$ ions is end pumped at said wavelength located on said wings of said main absorption feature of said laser crystal, wherein said laser crystal is operable at high average power.

2. The apparatus of claim 1, further comprising an output coupler operatively located to complete an optical cavity with said laser crystal.

3. The apparatus of claim 1, wherein said output face is coated to transmit light at about 2 micrometers.

4. The apparatus of claim 1, wherein said output face is coated to partially reflect light at about 2 micrometers.

5. The apparatus of claim 1, wherein said means for end-pumping said laser crystal comprise at least one semiconductor laser diode array.

6. The apparatus of claim 5,
wherein said at least one semiconductor laser diode array comprises microchannel coolers,
wherein said at least one semiconductor laser diode array further comprises at least one cylindrical lens configured to collect light from said at least one semiconductor laser diode array, and
wherein said apparatus further comprises a lens duct to collect light from said microlens and to deliver said light to an end of said laser crystal.

7. The apparatus of claim 6, wherein said cylindrical lens comprises:
a first optical surface; and,
a second optical surface positioned between 50 and 1000 microns of the first surface;
said first and second surfaces being formed so that the lens is substantially diffraction limited over its numerical aperture;
said cylindrical microlens having a numerical aperture greater than 0.4.

8. The apparatus of claim 6, wherein said lens duct comprises a material which is optically transparent and can be polished;
said lensing duct including an input end, an output end, and a plurality of continuously extending flat sides interconnecting said input and output ends;
said input end being of a greater cross-section than said output end and including a coating of antireflective material; and
said plurality of sides being uncoated and preventing light from escaping by reflective waveguiding due to internal reflection of the light beam.

9. The apparatus of claim 6, wherein said lens duct comprises a block of material which is optically transparent and can be polished, said block comprising:
a curved input end having an antireflective coating thereon, and an output end, said input and output ends being connected by uncoated sides which perform a waveguide function;
said uncoated sides each defining a continuous flat surface; and
said curved input end of said block having a greater cross-section than said output end of said block.

10. The apparatus of claim 6, wherein said lens duct comprises optically transparent material which can be polished and having an input and an output end interconnected by a continuous tapering section for focusing down a beam from said at least one laser diode array onto laser crystal;
said input end being provided with an anti-reflective coating, and said tapering section being uncoated and producing reflective waveguiding by internal reflection of the beam.

11. The apparatus of claim 10, wherein said lensing duct has a curved input end face and has a length, L, defined by the formula $L=\alpha nR/(n-1)$, where $\alpha$ is a numerical optimization factor, n is the index of refraction of the material, and R is the radius of curvature of the curved face of said input end.

12. The apparatus of claim 1, wherein said crystal is selected from a group consisting of a rod and a slab.

13. The apparatus of claim 12, wherein said laser crystal comprises YAG.

14. The apparatus of claim 12, wherein said crystal comprises at least 2% $Tm^{3+}$.

15. The apparatus of claim 1, wherein said laser crystal comprises a host material selected from a group consisting of $Y_3Al_5O_{12}$ (YAG), $(Y,Lu)_3Al_5O_{12}$ (LYAG) and $Lu_3Al_5O_{12}$ (LAG).

16. The apparatus of claim 15, wherein said crystal is pumped at a wavelength anywhere in the wing of the main absorption feature located at approximately 785 nm.

17. An apparatus, comprising:
a laser crystal doped with $Tm^{3+}$ ions and having an end pump face coated to transmit light within a first range of about 755 nm to about 815 nm, said laser crystal comprising an output face, wherein said end pump face is coated to reflect light at about 2 micrometers, wherein said crystal comprises about 4% $Tm^{3+}$ in a host material of YAG, wherein said crystal comprises an end pump face coated to transmit light at about 805 nm; and
means for end pumping said laser crystal at 805 nm.

* * * * *